(12) United States Patent
Kim et al.

(10) Patent No.: US 9,693,444 B2
(45) Date of Patent: Jun. 27, 2017

(54) MOBILE TERMINAL

(71) Applicant: LG ELECTRONICS INC., Seoul (KR)

(72) Inventors: Sungjin Kim, Seoul (KR); Seongcheol Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 70 days.

(21) Appl. No.: 14/421,259

(22) PCT Filed: Jul. 16, 2013

(86) PCT No.: PCT/KR2013/006350
§ 371 (c)(1),
(2) Date: Jun. 8, 2015

(87) PCT Pub. No.: WO2014/027760
PCT Pub. Date: Feb. 20, 2014

(65) Prior Publication Data
US 2015/0342024 A1    Nov. 26, 2015

(30) Foreign Application Priority Data

Aug. 13, 2012 (KR) ........................ 10-2012-0088164

(51) Int. Cl.
*H05K 5/00* (2006.01)
*H05K 7/00* (2006.01)
(Continued)

(52) U.S. Cl.
CPC ......... *H05K 1/0203* (2013.01); *G06F 1/1626* (2013.01); *G06F 1/1656* (2013.01);
(Continued)

(58) Field of Classification Search
CPC ........... H01M 2/1066; H01M 10/6551; H01M 2220/30; G06F 1/203; G06F 1/1658;
(Continued)

(56) References Cited

U.S. PATENT DOCUMENTS

2002/0061436 A1    5/2002    Inagaki et al.
2004/0132503 A1    7/2004    Chiu
(Continued)

FOREIGN PATENT DOCUMENTS

CN    1630208 A    6/2005
CN    101253696 A    8/2008
(Continued)

*Primary Examiner* — Courtney Smith
*Assistant Examiner* — Matt Dhillon
(74) *Attorney, Agent, or Firm* — Birch, Stewart, Kolasch & Birch, LLP

(57) ABSTRACT

A mobile terminal is disclosed. A mobile terminal according to the present invention comprises a housing; PCB installed inside the housing; and a battery pack disposed at least one side of the PCB and including at least one heat conductive layer radiating heat generated from the PCB. According to the present invention, a mobile terminal is capable of radiating heat generated from PCB by disposing part of a battery pack on one side of the PCB and of increasing capacity of the battery pack by utilizing a housing for the battery pack.

4 Claims, 5 Drawing Sheets

(51) Int. Cl.
  *H05K 1/02* (2006.01)
  *H04B 1/3888* (2015.01)
  *H04M 1/02* (2006.01)
  *H05K 7/20* (2006.01)
  *H04B 1/036* (2006.01)
  *G06F 1/20* (2006.01)
  *H01M 2/10* (2006.01)
  *H01M 10/6551* (2014.01)
  *G06F 1/16* (2006.01)

(52) U.S. Cl.
  CPC ............ *G06F 1/1658* (2013.01); *G06F 1/203* (2013.01); *H01M 2/1066* (2013.01); *H01M 10/6551* (2015.04); *H04B 1/036* (2013.01); *H04B 1/3888* (2013.01); *H04M 1/0262* (2013.01); *H04M 1/0277* (2013.01); *H05K 7/20445* (2013.01); *H01M 2220/30* (2013.01)

(58) Field of Classification Search
  CPC .. G06F 1/1626; G06F 1/1656; H04M 1/0277; H04M 1/0262; H05K 1/0203; H05K 7/20445; H04B 1/036; H04B 1/3888
  USPC .................. 361/681, 699, 700, 708, 709
  See application file for complete search history.

(56) References Cited

U.S. PATENT DOCUMENTS

| | | | |
|---|---|---|---|
| 2005/0136967 A1 | 6/2005 | Jeon | |
| 2006/0198102 A1 | 9/2006 | Cho | |
| 2007/0115644 A1* | 5/2007 | Kim | G06F 1/1626 361/720 |
| 2010/0136405 A1 | 6/2010 | Johnson et al. | |
| 2011/0064983 A1* | 3/2011 | Yokoyama | H01M 2/1066 429/100 |
| 2011/0183183 A1* | 7/2011 | Grady | H01M 2/1022 429/152 |
| 2012/0015223 A1 | 1/2012 | Bhardwaj et al. | |
| 2012/0015236 A1* | 1/2012 | Spare | H01M 2/0275 429/162 |
| 2012/0044635 A1* | 2/2012 | Rothkopf | G06F 1/1626 361/679.54 |
| 2012/0044637 A1* | 2/2012 | Rothkopf | G06F 1/1626 361/679.55 |
| 2012/0140419 A1* | 6/2012 | Ribas | H05K 7/20454 361/714 |
| 2013/0053110 A1* | 2/2013 | Pope | H01M 2/1066 455/572 |
| 2013/0128462 A1* | 5/2013 | Zadesky | C23C 16/26 361/705 |
| 2013/0136966 A1* | 5/2013 | Bhardwaj | H05K 7/20481 429/94 |
| 2013/0143074 A1* | 6/2013 | Kim | B29C 45/1676 429/7 |
| 2013/0321361 A1* | 12/2013 | Lynch | G09G 3/3225 345/204 |

FOREIGN PATENT DOCUMENTS

| | | |
|---|---|---|
| CN | 102332599 A | 1/2012 |
| JP | 2010-73606 A | 4/2010 |
| KR | 2003-0066960 A | 8/2003 |
| KR | 10-2004-0059384 A | 7/2004 |
| KR | 10-2006-0098769 A | 9/2006 |
| KR | 10-2008-0008861 A | 1/2008 |

* cited by examiner

MOBILE TERMINAL

CROSS-REFERENCE TO RELATED APPLICATIONS

This application is the National Phase of PCT International Application No. PCT/KR2013/006350, filed on Jul. 16, 2013, which claims priority under 35 U.S.C. 119(a) to Patent Application No. 10-2012-0088164, filed in the Republic of Korea on Aug. 13, 2012, all of which are hereby expressly incorporated by reference into the present application.

BACKGROUND OF THE INVENTION

Field of the Invention

The present invention is related to a mobile terminal and more specifically, a mobile terminal capable of radiating heat generated from PCB by disposing part of a battery pack on one side of the PCB and capable of increasing capacity of the battery pack by utilizing a housing for the battery pack.

Discussion of the Related Art

As functions of terminals such as personal computers, laptop computers, cellular phones diversify, the terminals become multimedia players having multiple functions for capturing pictures or moving images, playing music, moving image files and games and receiving broadcasting programs.

Terminals can be categorized as mobile terminals and stationary terminals. The mobile terminals can be further comprised of handheld terminals and vehicle mount terminals according to whether users can personally carry the terminals. Conventional terminals including mobile terminals provide an increasing number of complex and various functions.

To support and enhance the increasing number of functions in a terminal, improving a structural part and/or a software part of the terminal would be desirable.

In order to use a battery pack in a rectangular shape, modification of its shape and/or disposition may be needed.

SUMMARY OF THE INVENTION

The present invention has been made in an effort to provide a mobile terminal capable of radiating heat generated from PCB by disposing part of a battery pack on one side of the PCB and capable of increasing capacity of the battery pack by utilizing a housing for the battery pack.

To achieve the objective above, a mobile terminal according to one embodiment of the present invention comprises a housing; PCB installed inside the housing; and a battery pack disposed at least one side of the PCB and including at least one heat conductive layer radiating heat generated from the PCB.

The battery pack can be disposed such that it directly faces at least one of an upper surface, a left-side surface, and a right-side surface of the PCB.

The housing can include an arch-shaped edge on at least one side, and the battery pack can include the heat conductive layer on at least part of an inner area of the edge, where at least one of thickness and volume of the heat conductive layer is formed differently. The battery pack can be installed in an elongated form to occupy the space assigned to at least one surface of at least one component included within the housing.

Also, to achieve the objective above, a mobile terminal according to one embodiment of the present invention comprises a housing; PCB installed inside the housing; and a battery pack including a layer where at least one of thickness and volume thereof is different, disposing at least part of the layer on an upper surface of the PCB, and having a first cross-sectional shape and a second cross-sectional shape being different from each other.

A mobile terminal according to one embodiment radiates heat generated from PCB by disposing part of a battery pack on one surface of the PCB and increases capacity of the battery pack by utilizing a housing for the battery pack.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Arrangements and embodiments may now be described more fully with reference to the accompanying drawings, in which exemplary embodiments may be shown. Embodiments may, however, be embodied in many different forms and should not be construed as being limited to embodiments set forth herein; rather, embodiments may be provided so that this disclosure will be thorough and complete, and will fully convey the concept to those skilled in the art.

An electronic device may be described below with reference to the accompanying drawings. In the following description, suffixes "module" and "unit" may be given to components of the electronic device in consideration of only facilitation of description and do not have meanings or functions discriminated from each other.

The electronic device may include a cellular phone, a smart phone, a laptop computer, a digital broadcasting terminal, personal digital assistants (PDA), a portable multimedia player (PMP), a navigation system and/or so on.

Figure 1:
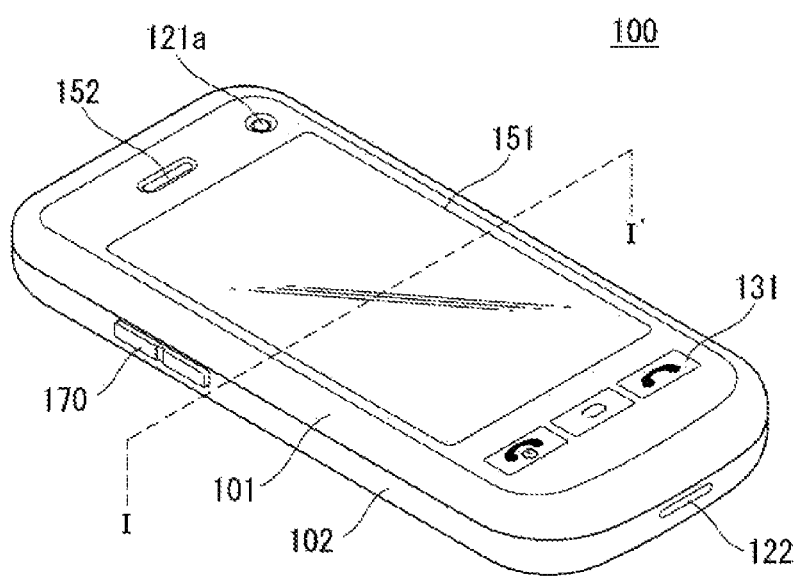
FIG. 1 is a front perspective view of a mobile terminal related to an embodiment.
Figure 2:
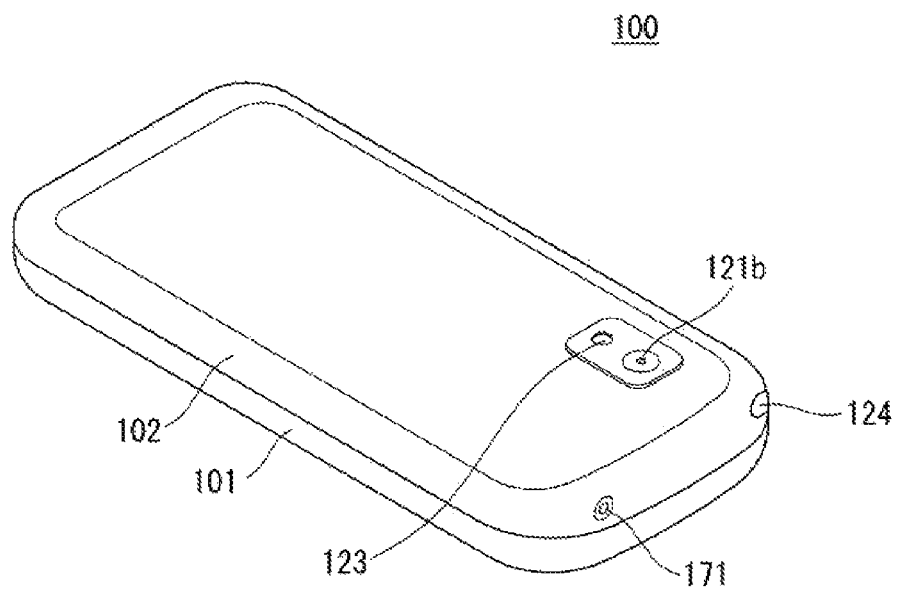
FIG. 2 is a rear perspective view of the mobile terminal.

FIG. 1 is a front perspective view of a mobile terminal related to an embodiment, and FIG. 2 is a rear perspective view of the mobile terminal of FIG. 2.

As illustrated in FIGS. 1 and 2, the mobile terminal 100 according to an embodiment may have a bar-type body. The bar-type body may be formed by injection-molding a synthetic resin or may be formed of a metal, for example, stainless steel (STS), titanium, or the like. However, the present disclosure is not limited thereto and may be applicable to various structures such as a slide type, a folder type, a swing type, a swivel type, and the like, in which two or more bodies are combined to be relatively movable.

In an assembled state, a front case 101 and a battery cover 102 may be exposed to the outside.

The front case 101 may be a portion of a front side of the mobile terminal 100. A display 151, an audio output unit 152, a front camera 121a, a user input unit 131, a microphone 122, and the like, may be disposed in the front case 101.

The display 151 may be positioned in the front side of the front case 101. The display 151 may display various types of information required for an operation of the mobile terminal 100. The display 151 may display a 2D image and/or a 3D image.

The audio output unit 152 may be a speaker outputting a reception sound, or the like. A plurality of audio output units 151 may be provided. For example, a plurality of audio output units 152 for outputting a reception sound or a bell sound may be provided.

The front camera 121a may be positioned to capture a user. For example, the user may perform a video call with a different user based on his or her image captured through the front camera 121a.

The user input unit 131 may be manipulated to receive a command for controlling an operation of the mobile terminal 100 and may include a plurality of manipulation units. The user input unit 131 may be sensed in a capacitive manner, and may generate light when a user input is applied thereto.

The user input unit 131 may be generally referred to as a manipulating portion and any method may be employed if it is a tactile manner allowing the user to perform manipulation with a tactile feeling. For example, the user input unit 131 may be a physical button.

The user input unit may be allocated a function having high frequency or a major function. For example, functions such as starting and terminating the mobile terminal 100 and/or an application, volume adjustment, and the like, may be allocated to the user input unit 131.

The microphone 122 may be a device for obtaining a user voice, and the like. The microphone 122 may be positioned in a lower portion of the mobile terminal 100.

As illustrated in FIG. 2, a battery cover 102 may be exposed to the rear side of the mobile terminal 100 according to embodiment. An earphone jack 171, an antenna 124, a rear camera 121b, a side key button 170, and a second optical output unit 10b may be positioned in the rear side exposing the battery camera 102.

The earphone jack 171 may output a sound output from the mobile terminal 100 through an earphone. The earphone jack 171 may include a terminal for receiving a manipulation signal for controlling a function of the mobile terminal through a button provided in the earphone, as well as a terminal for transmitting an audio signal.

The antenna 124 may be used to obtain a broadcast signal for viewing DMB, or the like. For example, in order to smoothly receive a broadcast signal, the user may draw the antenna 124 out of the terminal body to use it.

The rear camera 121b may be positioned in the rear side of the mobile terminal 100. The rear camera 121b may capture a stereoscopic image. For example, the rear camera 121b may capture an image for a left eye and an image for a right eye.

A camera flash 123 may be positioned to be adjacent to the rear camera 121b. The camera flash 123 may operate when an image is captured.

The side key button 170 may be positioned in the lateral side of the mobile terminal 100. A sound volume of the mobile terminal 100 may be adjusted through an operation of pushing an upper or lower side of the volume adjustment switch 170.

Figure 3:
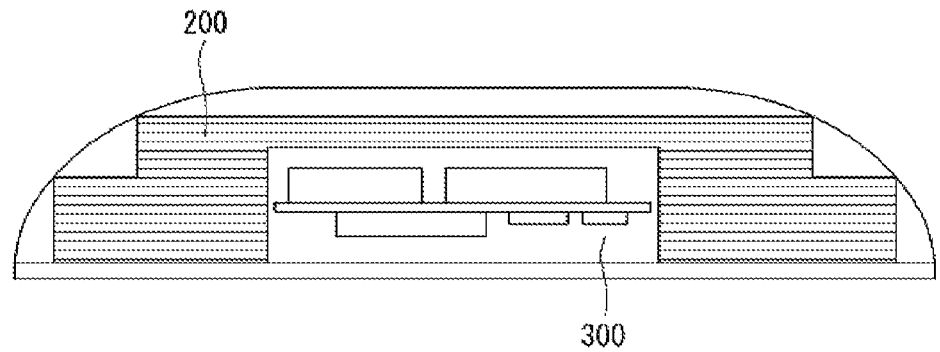
FIG. 3 is a I-I' cross-sectional view of the mobile terminal of FIG. 1 according to one embodiment of the present invention.

FIG. 3 is a I-I' cross-sectional view of the mobile terminal of FIG. 1 according to one embodiment of the present invention.

As shown in the figure, a battery pack 200 and PCB 300 are installed inside the housing of a mobile terminal 100 according to one embodiment of the present invention.

A battery pack 200 according to one embodiment of the present invention surrounds the PCB 300 so that the heat generated from the PCB 300 can be prevented from being transferred directly to the surface of the mobile terminal.

Part of the battery pack 200 can be disposed at least one surface of the PCB 300. In other words, part of the battery pack 200 can face directly at least one of an upper surface, a left-side surface, and a right-side surface.

The battery pack 200 can include at least one heat conductive layer which radiates heat generated from the PCB 300. As one embodiment, a heat conductive layer can include such materials as aluminum (Al) and copper (Cu). This implies that aluminum (Al) and copper (Cu) forming the battery pack 200 can play a role of a graphite sheet. In other words, since Al and Cu have a high heat conductivity, heat generated from the PCB 300 can be radiated.

As a heat conductive layer made from materials with a high heat conductivity included in the battery pack 200 is installed such that the heat conductive layer surrounds the PCB 300, the battery pack 200 plays a role of a radiation sheet. Due to this, an advantageous effect of reducing material costs can be achieved, tool.

Also, by installing part of the battery pack 200 in a gap formed between the PCB 300 and the housing, the overall thickness of the mobile terminal 100 can still be retained while capacity of the battery pack 200 can be increased.

Figure 4:
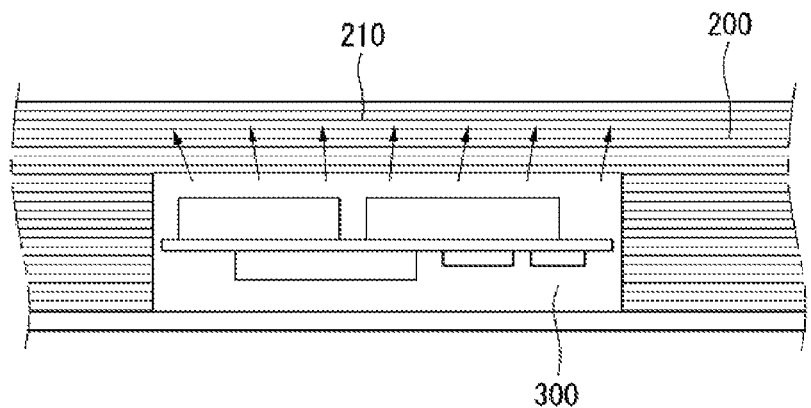
FIG. 4 is a cross-sectional view of a mobile terminal to illustrate a radiation effect of a battery pack according to one embodiment of the present invention.

FIG. 4 is a cross-sectional view of a mobile terminal to illustrate a radiation effect of a battery pack according to one embodiment of the present invention.

As shown in the figure, part of the battery pack 200 according to one embodiment of the present invention plays a role of radiating heat generated from the PCB 300.

On an upper surface of the PCB 300, part of the battery pack 200 can be disposed. The battery pack 200 can include a heat conductive layer with a high heat conductivity. As one embodiment, a heat conductive layer can be formed from materials such as aluminum (Al) and copper (Cu).

In case the PCB is exposed to the surface of the mobile terminal, heat generated from the PCB can be transferred to the terminal directly. Since part of the battery pack 200 is installed on an upper surface of the PCB, it can play a role of a graphite sheet for heat radiation. Due to this structure, an additional effect of reducing material costs can be obtained.

Figure 5:
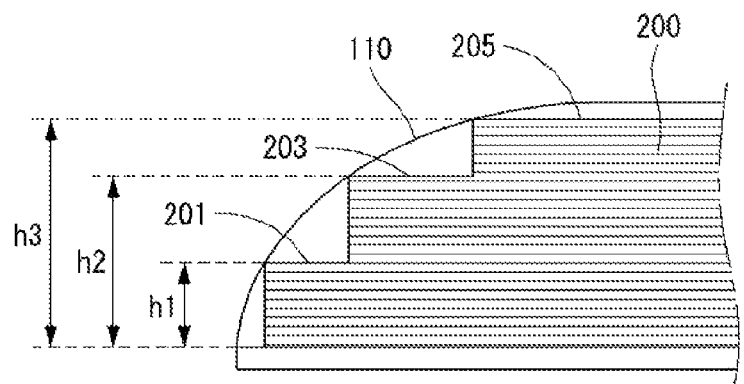
FIG. 5 is an enlarged cross-sectional view of an edge part of a battery pack according to one embodiment of the present invention.

FIG. 5 is an enlarged cross-sectional view of an edge part of a battery pack according to one embodiment of the present invention.

As shown in the figure, part of the battery pack 200 of a mobile terminal 100 according to one embodiment of the present invention can be formed in a shape to maximize an edge part of a housing.

A housing can include an arch-shaped edge part 110 at least in one side thereof. Inside the arch-shaped edge part 110, layers forming the battery pack 200 are laminated such that at least one of thickness and volume of individual layers differs from each other. In other words, as one embodiment of the present invention, the edge part of the battery pack 200 can be formed in a stair shape.

Based on the arch-shaped edge part 110, each layer included in the battery pack can have thickness different from each other. For example, a first layer 201 can have a thickness of h1, a second layer 203 a thickness of h2, and a third layer 205 a thickness of h3.

Since part of the battery pack 200 disposed in the arch-shaped edge part 110 are installed in a stair shape, unused space after installation of the battery pack 200 can be minimized. Accordingly, while a housing is utilized, capacity of the battery pack 200 can be increased to the maximum.

Figure 6:
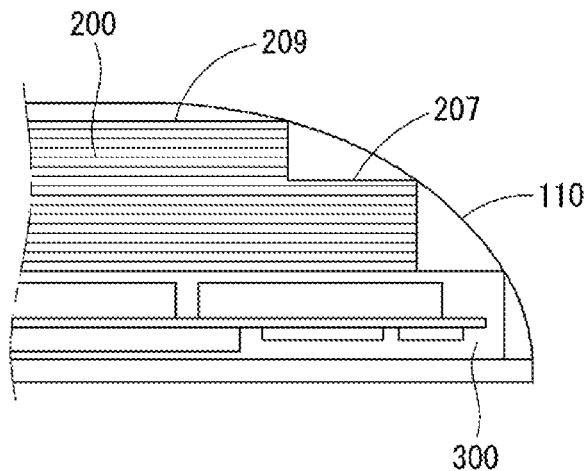
FIGS. 6 to 7 are enlarged cross-sectional views of an edge part of a battery pack according to one embodiment of the present invention.
Figure 7:
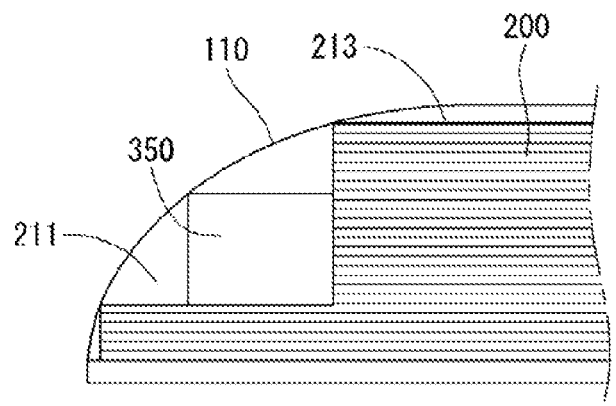

FIGS. 6 to 7 are enlarged cross-sectional views of an edge part of a battery pack according to one embodiment of the present invention.

FIG. 6 illustrates a structure where PCB 300 and part of a battery pack 200 are disposed together in an edge part of a housing according to one embodiment of the present invention.

The housing can include an arch-shaped edge part at least in one side thereof. Part of the battery pack 200 can be disposed on an upper surface of the PCB 300.

Part of the battery pack 200 can be disposed in a gap formed between the PCB 300 and the edge part 100 of the housing. Part of the battery pack installed inside the arch-shaped edge part of the housing can consist of layers, each of which is different from the others in terms of at least one of thickness and volume.

In other words, the battery pack 200 is first disposed inside the arch-shaped edge part 110, and structure of the battery pack 200 is formed to minimize unused space. This implies that the inner space of the arch-shaped edge part 110 of the housing can be fully utilized by forming thickness or volume of the first layer 207 and the second layer 209, which are part of the battery pack, to differ from each other.

By utilizing the inner space of the housing, capacity of the battery pack 200 can be increased. Also, since the heat conductive layer included in the battery pack 200 disposed on an upper surface of the PCB plays a role of graphite sheet, an advantageous effect of radiating heat generated from the PCB can be achieved.

FIG. 7 illustrates a structure where a component 350 included in the mobile terminal and part of the battery pack 200 are disposed in the edge part 110 of the housing according to one embodiment of the present invention.

The battery pack can be installed in an elongated form to occupy the space assigned to at least one surface of at least one component included within the housing.

In other words, if there is space available in a lower surface of at least one component 350, the battery pack 200 can be installed therein. This implies that at least one of thickness and volume of the first layer 211 and the second layer 213, which are part of the battery pack, can be made to differ from each other.

Since the remaining space formed after disposition of a component 350 included in the mobile terminal 100 is fully utilized, an advantageous effect of increasing capacity of a battery pack can be obtained.

Figure 8:
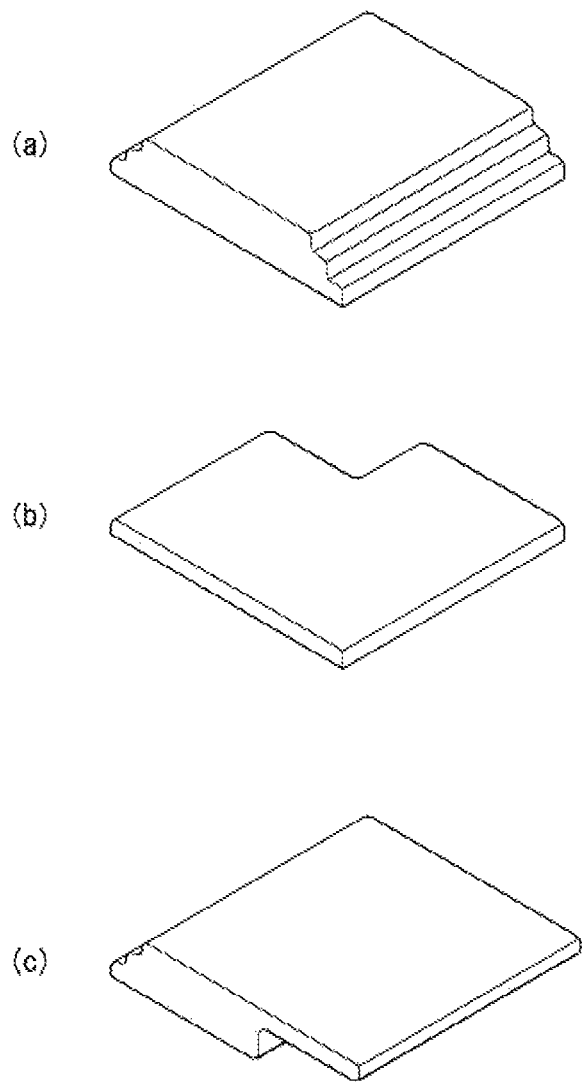
FIG. 8 illustrates the shape of a battery pack according to one embodiment of the present invention.

FIG. 8 illustrates the shape of a battery pack according to one embodiment of the present invention.

FIGS. 8(*a*) to 8(*c*) illustrate shapes of a battery pack according to various embodiments of the present invention.

As shown in FIG. 8(*a*), as one embodiment of the present invention, in case the housing includes an arch-shaped edge part, the edge part of the battery pack 200 can be formed in a stair shape.

As shown in FIG. 8(*b*), as one embodiment of the present invention, the battery pack can be formed in a '⌐' shape in order to secure space in which a component included in the mobile terminal 100 is disposed.

As shown in FIG. 8(*c*), as one embodiment of the present invention, part of the battery pack can be formed in a stair shape, and the other part can be formed in a '⌐' shape. In other words, in case the housing includes an arch-shaped edge part, the inner space of the arch-shaped edge part can be fully utilized. Also the space excluding the area in which a component used by the mobile terminal, PCB, and the like are disposed can be fully utilized.

As shown in FIG. 8, the battery pack can comprise layers, each of which is different from the others in terms of at least one of thickness and volume. In other words, the battery pack can be formed to have a first cross-sectional shape differ from a second cross-sectional shape. This implies that shapes of cross-sections obtained by cutting the battery pack at arbitrary positions can differ from each other.

As the inner space of the housing of the mobile terminal 100 is fully utilized, capacity of the battery pack 200 can be increased. In other words, since the space remaining after disposing a component used by the mobile terminal 100, PCB, and others is fully utilized, capacity of the battery pack can be increased.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A mobile terminal, comprising:
    a housing including an arch-shaped edge on a first side and a second side, wherein the first side is opposite to the second side;
    a printed circuit board (PCB) installed inside the housing and between the first and second sides; and
    a battery pack disposed within the housing and between the PCB and a surface of the housing, the battery pack having a stair shape structure,
    wherein the battery pack includes a first side having a first stair shape corresponding to and directly facing the first side of the housing and a second side having a second stair shape corresponding to and directly facing the second side of the housing,
    wherein the stair shape structure of the battery pack includes at least a first layer and a second layer, and the first layer has a shorter width than the second layer and the first layer is disposed between the second layer and the housing, and
    wherein the battery pack is disposed such that the battery pack directly faces an upper surface of the PCB and a side surface the PCB.

2. The mobile terminal of claim 1, wherein the battery pack is disposed such that the battery pack directly faces at least one of a left-side surface of the PCB and a right-side surface of the PCB.

3. The mobile terminal of claim 1, wherein the battery pack includes a heat conductive layer on at least part of an inner area of the arch-shaped edge, and at least one of thickness and volume of the heat conductive layer is formed differently.

4. The mobile terminal of claim 1, wherein the battery pack is installed in an elongated form to occupy space assigned to at least one surface of at least one component included within the housing.

* * * * *